(12) United States Patent
Morishima

(10) Patent No.: US 7,411,448 B2
(45) Date of Patent: Aug. 12, 2008

(54) CLASS-D AMPLIFIER

(75) Inventor: Morito Morishima, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 11/818,492

(22) Filed: Jun. 14, 2007

(65) Prior Publication Data

US 2007/0247223 A1  Oct. 25, 2007

Related U.S. Application Data

(62) Division of application No. 11/115,696, filed on Apr. 27, 2005, now Pat. No. 7,317,349.

(30) Foreign Application Priority Data

Apr. 30, 2004  (JP)  ............... 2004-135786

(51) Int. Cl.
*H03F 3/38* (2006.01)
(52) U.S. Cl. .................... 330/10; 330/207 A
(58) Field of Classification Search .......... 330/10, 330/207 A, 251
See application file for complete search history.

(56) References Cited

U.S. PATENT DOCUMENTS

| | | | |
|---|---|---|---|
| 6,466,087 B2 | 10/2002 | Ruba | |
| 7,068,096 B2 | 6/2006 | Chu | |
| 7,158,865 B2 | 1/2007 | Smarandache | |
| 2004/0081053 A1* | 4/2004 | Kojima | 369/59.11 |

FOREIGN PATENT DOCUMENTS

| | | |
|---|---|---|
| JP | 59-183510 | 10/1984 |
| JP | 06-152269 | 5/1994 |
| JP | 2005-500625 | 1/2000 |
| JP | 2002-536903 | 10/2002 |
| JP | 2003-110376 | 4/2003 |
| KR | 20030097020 | 12/2003 |

OTHER PUBLICATIONS

Korean Intellectual Property Office ("Notice of Preliminary Rejection"), dated Aug. 1, 2007; Korean: 4 pgs., English translation: 9 pgs.
Lu, Qian, Zheng, Yao, Chen & Wang: "Reduction of Digital PWM Limit Ring with Novel Control Algorithm", dated 2001, 5 pgs.; Zhejiang University, Hangzhou 310027, PR China.
Korean Intellectual Property Office ("Notice of Submission of Argument", Dated: Jun. 25, 2007).

* cited by examiner

*Primary Examiner*—Khanh V Nguyen
(74) *Attorney, Agent, or Firm*—Pillsbury Winthrop Shaw Pittman LLP

(57) ABSTRACT

A PWM circuit converts output data of a calculator to a pulse width modulation signal, and outputs it to a load (speaker) through a buffer amplifier and a low-pass filter. A digital low-pass filter has the same filter characteristic as a low-pass filter. An error calculator calculates the error $\Delta(z)$ between the input data and the output of the filter, and outputs it to the calculator. The output of the filter becomes a digital signal having substantially the same digitalized waveform as an analog signal applied to the load, and also no distortion contains in the digital signal. Accordingly, the output data $\Delta(z)$ of the error calculator becomes data corresponding to the distortion of the output signal. In the calculator, the data $\Delta(z)$ is subtracted from the input data, and the subtraction result is applied to the PWM circuit to reduce the distortion.

2 Claims, 8 Drawing Sheets

$$g(t) = [1 - \frac{\omega_0}{\omega_f} e^{-\sigma_0 t} \sin(\omega_f t + \theta)]$$

FIG. 8 (a) Φa

FIG. 8 (b) ORIGINAL PWM

FIG. 8 (c) Φbx

FIG. 8 (d) PWM OUTPUT

CLASS-D AMPLIFIER

RELATED APPLICATIONS

This application is a divisional application of U.S. patent application Ser. No. 11/115,696, filed Apr. 27, 2005, now U.S. Pat. No. 7,317,349.

BACKGROUND OF THE INVENTION

The present invention relates to a Class-D amplifier used in fields such as audio, etc., and particularly to a Class-D amplifier that is improved to reduce the distortion and enhance the dynamic range.

Related PWM-modulation based Class-D amplifiers are designed so that a signal output from a PWM (pulse width modulation) circuit and then varied to an analog signal by a low-pass filter is converted to digital data by ADC (Analog/Digital Converter), and fed back to the front stage of the PWM circuit in order to reduce distortion (see Patent Document 1).

However, according to the construction as described above, there is a problem that the number of parts is increased and also the price is increased because ADC is needed.

Furthermore, the related Class-D amplifiers for subjecting PCM signals to PWM conversion have a problem that the dynamic range is determined by the clock frequency of the PWM circuit and only a dynamic range of 60 dB is achieved even when the clock frequency is equal to 300 MHz.

Patent Documents 2 to 5 are also known as documents in which conventional Class-D amplifiers are described.

Patent Document 1: JP-A-59-183510
Patent Document 2: JP-T-2002-536903
Patent Document 3: JP-A-06-152269
Patent Document 4: JP-A-2003-110376
Patent Document 5: JP-T-2000-500625

SUMMARY OF THE INVENTION

The present invention has been implemented in view of the foregoing situation, and has an object to provide a Class-D amplifier that can reduce the distortion by digital processing without using ADC. Furthermore, another object of the present invention is to provide a Class-D amplifier that can broad the dynamic range more than conventional ones without increasing the clock frequency of a PWM circuit.

In order to solve the aforesaid object, the invention is characterized by having the following arrangement.

(1) A Class-D amplifier:
a PWM circuit that converts a signal into a pulse-width modulation signal;
a buffer amplifier that amplifies an output of the PWM circuit;
an analog low-pass filter that passes low-frequency components of an output of the buffer amplifier and supplies the low-frequency components to a load;
a digital filter that filters the output of the PWM circuit, the digital filter having a same filter characteristic as the analog low-pass filter;
an error calculator that calculates a difference between the output of the digital filter and an input signal of an input terminal of the Class-D armplifier; and
an subtractor that subtracts an output of the error calculator from the input signal and applies the subtraction result to the input terminal of the PWM circuit.

(2) The Class-D amplifier according to (1), further comprising:
a delay circuit that delays truncation errors by one period of a sampling clock of the signal input to the PWM circuit, and outputs the delayed truncation errors; and
an adder that adds an output of the delay circuit to the input signal.

(3) The Class-D amplifier according to (1), further comprising:
a first delay circuit that delays truncation errors by one period of a sampling clock of the signal input to the PWM circuit, and outputs the delayed truncation errors thus delayed;
a second delay circuit that delays an output of the first delay circuit by one period of the sampling clock and outputting the delayed output;
a first level converter that adjusts a level of an output of the first delay circuit;
a second level converter that adjusts a level of an output of the second delay circuit; and
an adder that adds the outputs of the first and second level converting converters to the input signal.

(4) A Class-D amplifier:
a PWM circuit that converts a signal into a pulse-width modulation signal;
a buffer amplifier that amplifies an output of the PWM circuit;
an analog low-pass filter that passes low-frequency components of an output of the buffer amplifier and supplies the low-frequency components to a load;
a step response calculator that reads out a pulse width from the output signal of the PWM circuit and calculates a step response at the time that a pulse waveform having the pulse width is applied to the analog low-pass filter.
an error calculator that calculates a difference between the output of the step response calculator and an input signal of an input terminal of the Class-D amplifier; and
an subtractor that subtracts an output of the error calculator from the input signal and applies the subtraction result to the input terminal of the PWM circuit.

(5) The Class-D amplifier according to (4), further comprising:
a delay circuit that delays truncation errors by one period of a sampling clock of the input signal input to the PWM circuit, and outputs the delayed truncation errors; and
an adder that adds an output of the delay circuit to the input signal.

(6) A Class-D amplifier comprising:
a PWM circuit that converts a signal into a pulse-width modulation signal;
a buffer amplifier that amplifies an output of the PWM circuit;
an analog low-pass filter that passes low-frequency components of an output of the buffer amplifier and supplies the low-frequency components to a load;
an error predicting circuit that calculates a difference between a regular impulse response obtained by subjecting an input signal of an input terminal of the Class-D amplifier to amplitude modulation and an impulse response predicted to be obtained by subjecting the input signal to pulse width modulation through the PWM circuit; and
an subtractor that subtracts an output of the error predicting circuit from the input signal and applies the subtraction result to the input terminal of the PWM circuit.

(7) A Class-D amplifier comprising:

a delaying circuit that outputs output signals respectively obtained by delaying rising or falling of a master clock by m/n period, where n is an integer of 2 or more and m is an integer smaller than n;

a selecting circuit that selecting one of output signals of the delay circuit on the basis of a first group of bits of an input signal input to an input terminal of the Class-D amplifier; and a PMW circuit that converts a second group of the bits of the input signal to a pulse width modulation signal on the basis of the master clock, and generates a pulse signal that rises or falls at a timing indicated by the second group of the bits of the input signal and falls or rises at a timing delayed from the falling or rising timing indicated by the second group of bits by a time indicated by an output of the selecting circuit.

(8) The Class-D amplifier according to (7), further comprising:

a delay circuit that delays truncation errors by one period of a sampling clock of the input signal input to the PWM circuit, and outputs the delayed truncation errors; and an adder that adds an output of the delay circuit to the input signal.

(9) The Class-D amplifier according to (7), wherein the delay circuit comprises:

a ring oscillator comprising a plurality of delay amount variable inverters arranged in a ring shape;

a phase comparator that detects a phase difference between the master clock and an output of the ring oscillator;

a delay amount controller that controls a delay amount of each of the inverters; and a low-pass filter that extracts low-frequency components of an output of the phase comparator and outputs the low-frequency components to an input terminal of the delay amount controller.

(10) A Class-D amplifier comprising:

a PWM circuit that converts a signal into a pulse-width modulation signal;

a buffer amplifier that amplifies an output of the PWM circuit;

an analog low-pass filter that passes low-frequency components of an output of the buffer amplifier and supplies the low-frequency components to a load;

a level adjuster that adjusts an output level of the buffer amplifier;

an amplifier that amplifies a difference between the output of the PWM circuit and an output of the level adjuster;

an integrator that integrates an output of the amplifier; and a subtractor that subtracts an output of the integrator from an input signal input to an input terminal of the Class-D amplifier, and applies the subtraction result to an input terminal of the PWM circuit.

(11) The Class-D amplifier according to (10), further comprising:

a delay circuit that delays truncation errors by one period of a sampling clock of the input signal input to the PWM circuit, and outputs-the delayed truncation errors; and an adder that adds an output of the delay circuit to the input signal.

(12) A Class-D amplifier comprising:

a PWM circuit that converts a signal into a pulse-width modulation signal;

a buffer amplifier that amplifies an output of the PWM circuit;

an analog low-pass filter that passes low-frequency components of an output of the buffer amplifier and supplies the low-frequency components to a load;

a level adjuster that adjusts an output level of the analog low-pass filter;

a low-pass filter circuit that extracts low-frequency components of the output of the PWM circuit and has the same level characteristic as the circuit constructed by the buffer amplifier and the load;

an amplifier that amplifies a difference between an output of the low-pass filter circuit and an output of the level adjuster;

an integrator that integrates the output of the amplifier;

an analog/digital converter that converts an output of the integrator into a digital signal;

a phase compensator that adjusts a phase of an output of the analog/digital converter; and a subtractor that subtracts an output of the phase compensator from an input signal input to an input terminal of the Class-D amplifier and applies the subtraction result to an input terminal of the PWM circuit.

(13) A Class-D amplifier comprising:

a first PWM circuit that converts a signal to a pulse width modulation signal;

a buffer amplifier that amplifies an output of the first PWM circuit;

an analog low-pass filter that passes low-frequency components of an output of the buffer amplifier and supplies the low-frequency components to a load;

a delay circuit that delays truncation errors of the first PWM circuit by one period of a master clock of the first PWM circuit and outputs the delayed truncation errors;

a second PWM circuit having the same characteristic as the first PWM circuit;

a digital filter that filters an output of the second PWM circuit, the digital filter having the same filter characteristic as the analog low-pass filter;

an error calculator that calculates a difference between an output of the digital filter and an input signal input to an input terminal of the Class-D amplifier;

a subtractor that subtracts an output of the error calculator from the input signal, and applies the subtraction result to an input terminal of the second PWM circuit; and an adder that adds an output of the subtractor and an output of the delay circuit and applies the addition result to the first PWM circuit.

According to the invention, the distortion can be reduced without using any analog/digital converter. Furthermore, according to the invention, the dynamic range can be broadened more than the conventional ones without increasing the clock frequency of the PWM circuit.

BRIEF DESCRIPTION OF THE DRAWINGS

FIG. 8 is a timing chart showing the operation of the Class-D amplifier shown in FIG. 5.

DESCRIPTION OF PREFERRED
EMBODIMENTS

First Embodiment

Figure 1:
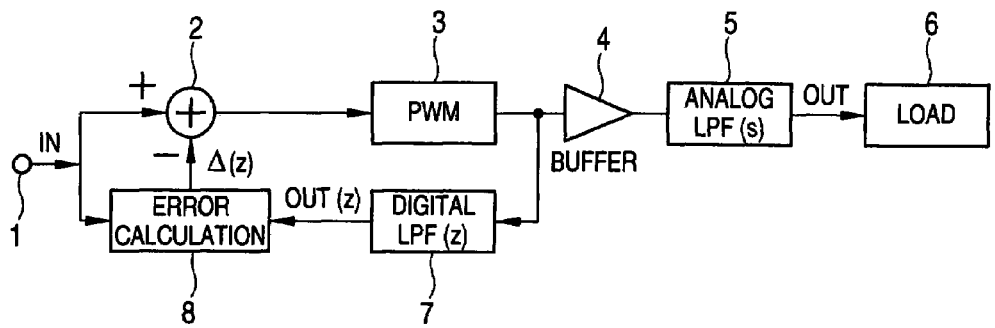
FIG. 1 is a block diagram showing the construction of a Class-D amplifier according to a first embodiment of the present invention.

Embodiments of the present invention will be described hereunder with reference to the accompanying drawings. FIG. 1 is a block diagram showing the construction of Class-D amplifier according to a first embodiment of the present invention. In FIG. 1, reference numeral 1 represents an input terminal to which input data (digital music data, PCM data, etc.) are input, 2 represents a calculator for subtracting data of a second input terminal from data of a first input terminal, 3 represents a PWM circuit, 4 represents a buffer amplifier, 5 represents an analog low-pass filter based on L (coil) and C (capacitor), 6 represents a load (speaker), 7 represents a digital low-pass filter having the same filter characteristic as the low-pass filter 5, and 8 represents an error calculator for calculating an error $\Delta(z)$ between the input data and the output of the low-pass filter 7.

In the construction as described above, the output of the digital low-pass filter 7 becomes a digital signal in which the approximately same waveform of an analog signal applied to a load 6 is digitalized, and the digital signal does not contain any distortion due to the buffer amplifier 4 and the analog low-pass filter 5. Accordingly, the output data $\Delta(z)$ of the error calculator 8 are set to the data corresponding to the distortion of the output signal. As a result, the distortion can be reduced by subtracting the data $\Delta(z)$ from the input data in the calculator 2 and then applying the subtraction result to the PWM circuit 3. Furthermore, the digital low-pass filter 7 may apply phase compensation so that a loop containing the digital low-pass filter 7 is stabilized.

Second Embodiment

Figure 3:
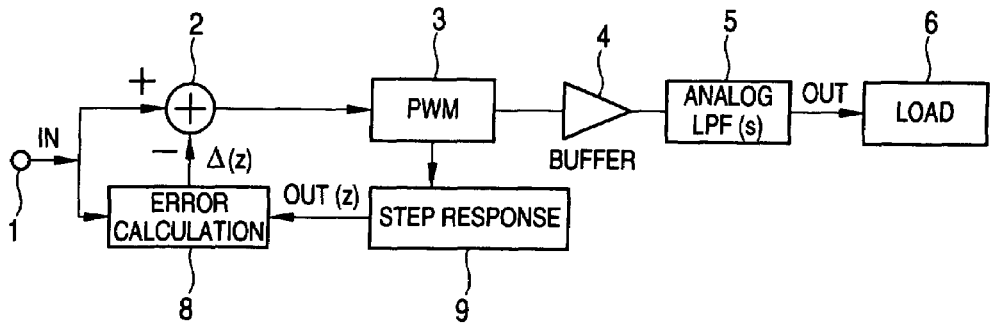
FIG. 3 is a block diagram showing the construction of a Class-D amplifier according to a second embodiment of the present invention.

It is necessary that the operating frequency of the circuit described above is increased to be about several ten times as high as the sampling frequency of the PWM circuit 3, and thus high-speed calculation is needed in a circuit (DSP; digital signal processor or the like) to implement the digital low-pass filter 7. Therefore, a second embodiment of the present invention which can achieve the same effect without using the digital low-pass filter 7 is shown in FIG. 3. The difference of this embodiment from the circuit of FIG. 1 resides in that a step response circuit 9 is provided in place of the digital low-pass filter 7.

Figure 2:
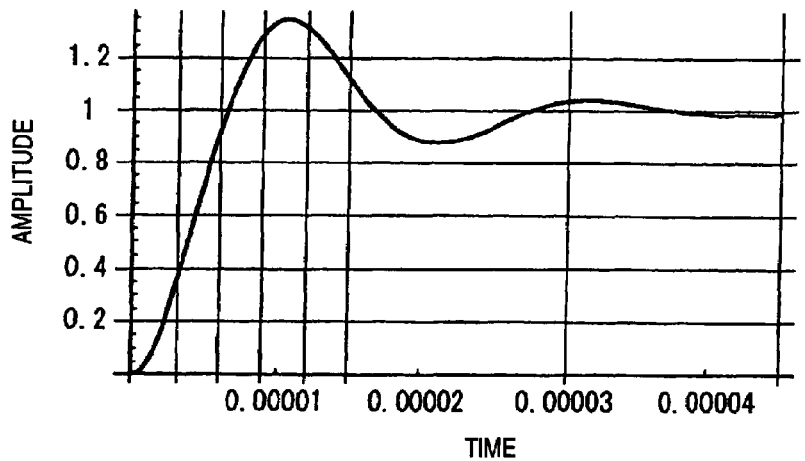
FIG. 2 is diagram and equation showing a step response of an analog low-pass filter 5 of FIG. 1.

The idea of this embodiment is as follows. Since the output of the PWM circuit 3 can be represented by only the period of the input data and the ON-time, the operation when the output of the PWM circuit 3 is applied to the analog low-pass filter 5 is the same as the response when a step waveform is applied to the analog low-pass filter 5, and thus the step response of the analog low-pass filter can be calculated by a well-known step response calculation. FIG. 2 shows a curved line indicating the step response of the analog low-pass filter 5, and this equation is an example of the calculation equation of the step response g(t). The curved line of FIG. 2 is achieved by plotting the value g(t) of this equation. Accordingly, the ON-time is read out from the data output from the PWM circuit 3, the step response of the analog low-pass filter 5 is calculated and the difference between the calculation result and the input data of the input terminal 1 is calculated by the error calculator 8, thereby calculating the error $\Delta(z)$. In this case, the step response may be calculated by the inverse Laplace transform of the characteristic equation of the analog low-pass filter 5. Alternatively, an actual measurement may be made in advance to store the measurement result in a table and interpolate inter-data values. In the case of the table, the distortion based on the load 6 can be also stored together, and thus characteristic correction of the load can be also carried out. Furthermore, it is possible to correct a rounding error at the rising/falling time in the PWM circuit 3.

Third Embodiment

Figure 4:
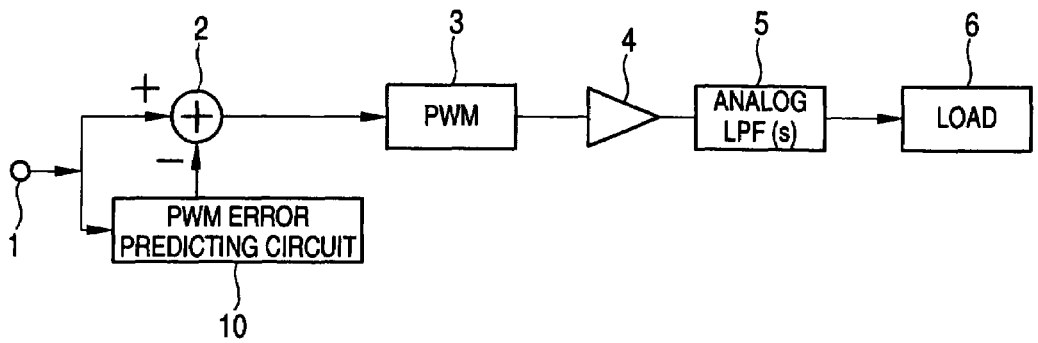
FIG. 4 is a block diagram showing the construction of a Class-D amplifier according to a third embodiment of the present invention.

FIG. 4 is a block diagram showing the construction according to a third embodiment of the present invention. The difference of this embodiment from that shown in FIG. 3 resides in that a PWM error predicting circuit 10 is provided in place of the error calculator 8 and the step response circuit 9 of FIG. 3.

The PWM error predicting circuit 10 calculates an error $\Delta(z)$ based on the difference between a correct impulse response achieved through amplitude modulation of input data of the input terminal 1 and an impulse response which is predicted to be achieved by the PWM circuit 3, and outputs the error to the operator 2. Specifically describing, when the analog low-pass filter 5 is an LC filter (see FIG. 13), the impedance of the circuit comprising the analog low-pass filter 5 and the load 6 is as follows:

Z (s)=R+sL+Zp (C, L)

R: series resistance of the path

Zp (C, L): Impedance of a parallel circuit comprising a capacitor and a load

The step response of this impedance is as follows:

G (t)=L$^{-1}$ {E/Z(z)·(1/s)}=(1-ke$^{(at)}$ sin ($\beta$t))

When the time from the rising of the input data is represented by t, the error $\Delta(z)$ is a difference between an ideal step response K$_1$·t and a step response g(t) or as follows:

$\Delta(z)$=K$_1$·t g(t)

K$_1$: a gain of the step response of an ideal integrator

Figure 16:
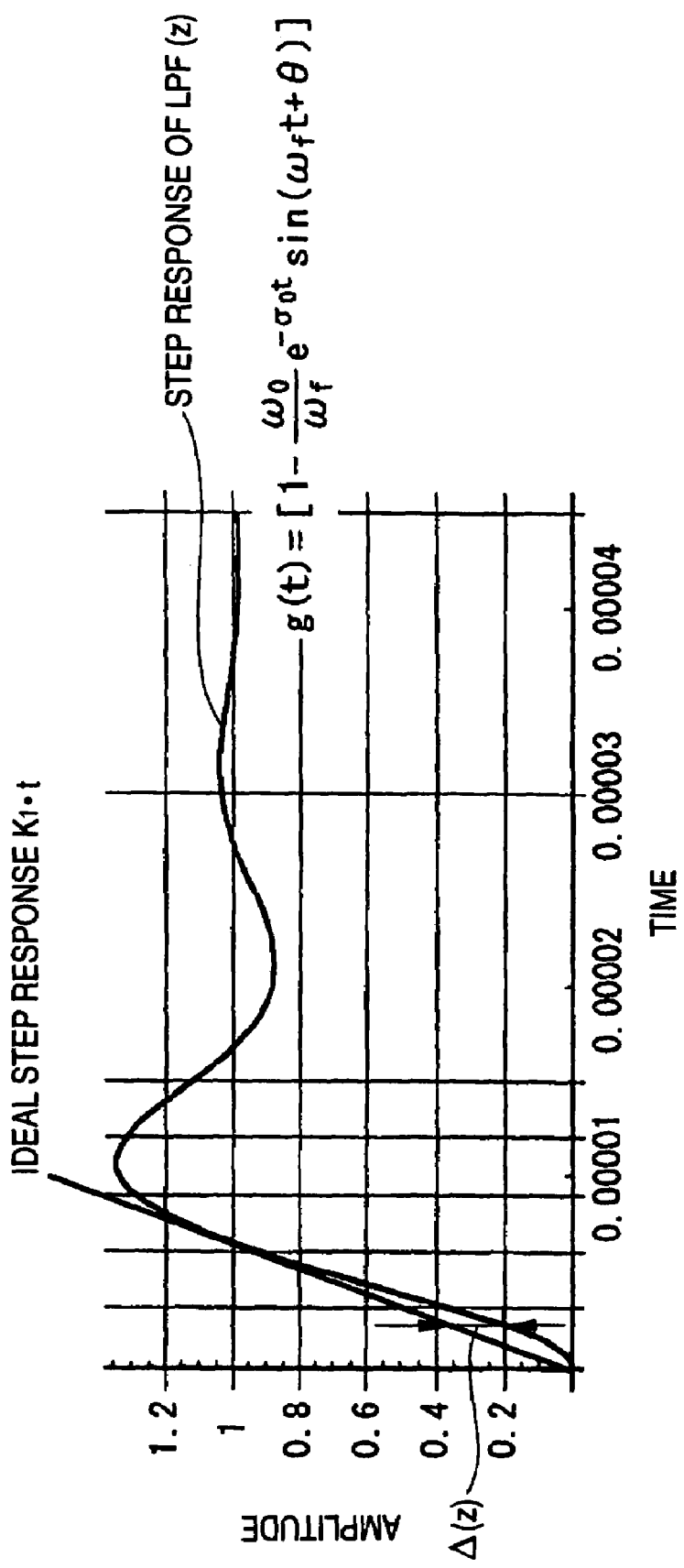
FIG. 16 is diagram and equation showing a straight line of an ideal step response, a curve of an step response of LPF(z) and a difference $\Delta(z)$ therebetween, explaining a fourth embodiment.

A value of K$_1$ is determined so as to match with the gain at a rising portion of g(t). FIG. 16 shows a straight line of the ideal step response, a curve of the step response of LPF (z)

and a difference Δ(z) therebetween. This embodiment has an advantage that there is no feedback loop and thus no oscillation occurs.

Fourth Embodiment

Next, a fourth embodiment of the present invention will be described with reference to FIGS. 5 to 8.

Figure 5:
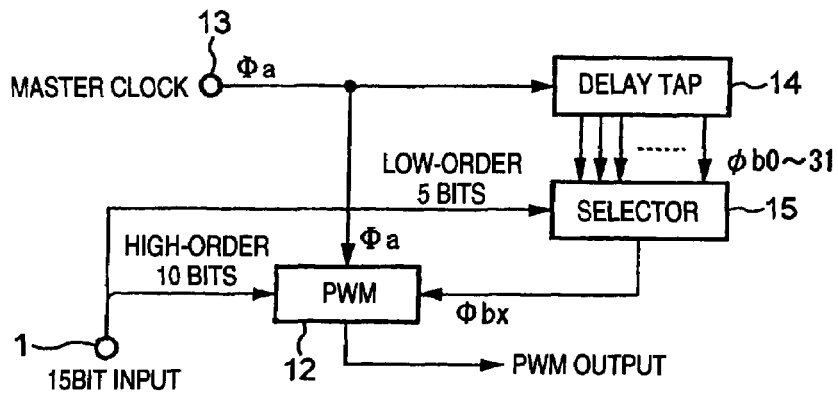
FIG. 5 is a block diagram showing the construction of a Class-D amplifier according to a fourth embodiment of the present invention.

FIG. 5 is a block diagram showing the construction of a main part of a Class-D amplifier according to the fourth embodiment. In FIG. 5, reference numeral 1 represents an input terminal to which input data is input. Now, it is assumed that the bit number of the input data is set to 15 bits. 12 represents a PWM circuit, and the bit number of the internal circuit is set to 10 bits. In this case, high-order 10 bits of the input data are input to the PWM circuit 12. 13 represents a terminal to which a master clock Φa is input, and the master clock Φa is input to the PWM circuit 12 and a delay tap circuit 14. The delay tap circuit 14 is a circuit for generating clock pulse Φ0, Φb1, Φb2, . . . , Φb31 by delaying the master clock Φa by 0/32 period, 1/32 p period, . . . , 31/32 period respectively. These clock pulses Φb0 to Φb31 are output to a selector 15. The selector 15 selects any one of the clock pulses Φb0 to Φb31 on the basis of the lower-order 5 bits of the input data, and outputs it to the PWM circuit 12.

Figure 6:
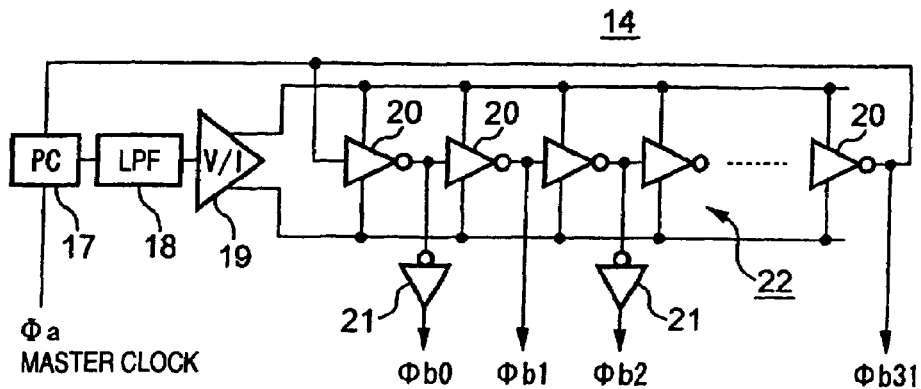
FIG. 6 is a block diagram showing the construction of a delay tap circuit of FIG. 5.
Figure 7:
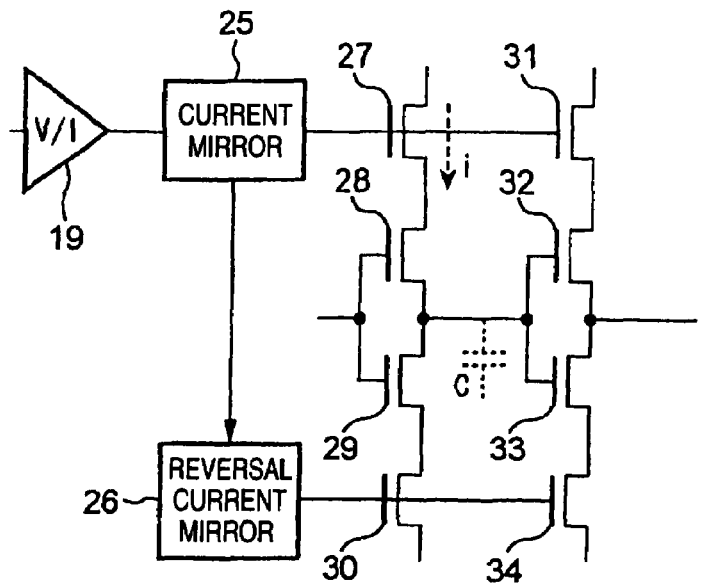
FIG. 7 is a circuit diagram showing the construction of an inverter 20 of FIG. 6.

FIG. 6 is a block diagram showing the construction of the delay tap circuit 14. In FIG. 6, 17 represents a phase comparator, 18 represents a low pass filter; 19 represents a voltage/current converting circuit, and 20 represents 32 inverters connected to one another in series. The inverter 20 is a delay-amount variable inverter whose delay amount is varied in accordance with the output of the voltage/current converting circuit 19, and FIG. 7 shows the construction of the inverter 20. In FIG. 7, 25 represents a current mirror circuit, 26 represents a reversal current mirror circuit and 27 to 34 represent MOS FETs. Current limiting MOS FETs 27, 31, 30, 34 are provided at the upper and lower sides of the reversal circuit comprising the MOS FETs 28, 29, 32, 33, and current is limited by the current mirror circuits 25, 26. The charging time of a parasitic capacitor C is controlled by this current, whereby the delay amount can be varied.

In FIG. 6, the 32 inverters 20 constitute a ring oscillator 22 by connecting the input terminal of the forefront inverter 20 to the output terminal of the rearmost inverter 20. The output of the rearmost inverter 20 is input to one input terminal of the phase comparator 17. The circuit comprising the phase comparator 17, the low-pass filter 18, the voltage/current converting circuit 19 and the ring oscillator 22 constitute PLL (Phase locked loop). In this construction, the ring oscillator 22 oscillates at the same frequency in synchronism with the master clock Φa input to the other input terminal of the phase comparator 17. Accordingly, the clock pulses Φb1 to Φb31 achieved by delaying the master clock Φa 1/32 period, 2/32 period, . . . , 31/32 period respectively are achieved as the respective outputs of the inverters 20. The outputs of the inverters 20 are inverted every -other output, and thus inverters 21, 21 are inserted to every other output to match the phase.

In order to create plural clock pulses which are delayed every fixed amount, they may be created by merely arranging delay elements. However, it is difficult for this construction to generate clock pulses which would be achieved by accurately dividing the master clock Φa into 32 equal parts, and the construction described above is effective to generate clocks corresponding to accurately equally divided 32 parts of the master clock Φa.

Returning to FIG. 5, the PWM circuit 12 is different from the PWM circuit 3 of FIG. 1 (FIG. 3, FIG. 4) described above in the following point. That is, the PWM circuit 3 of FIG. 1 generates and outputs a pulse whose rising and falling are synchronous with the rising of the master clock Φa as shown in FIG. 8A and FIG. 8B. Accordingly, the resolution of the PWM circuit 3 of FIG. 1 is determined by the frequency of the master clock Φa. On the other hand, when the clock pulse Φb output from the selector 15 is set to Φbx, the PWM circuit 12 of FIG. 5 generates a pulse which rises in synchronism with the master clock Φa, but falls at the first rising point of the clock pulse Φbx after the same timing as the falling of the PWM circuit 3 of FIG. 1. That is, in the PWM circuit 12, the falling timing of the output pulse is delayed by the time corresponding to the low-order 5 bits of the input data of the input terminal 1. Accordingly, the resolution and the dynamic range can be enhanced. For example, in the case where the master clock Φa is 300 MHz, even if the dynamic range is equal to about 50 dB in the construction of FIG. 1, the dynamic range can be enhanced till 90 dB in the construction of FIG. 5.

Fifth Embodiment

Next, a fifth embodiment according to the present invention will be described with reference to FIGS. 9 to 11.

Figure 9:
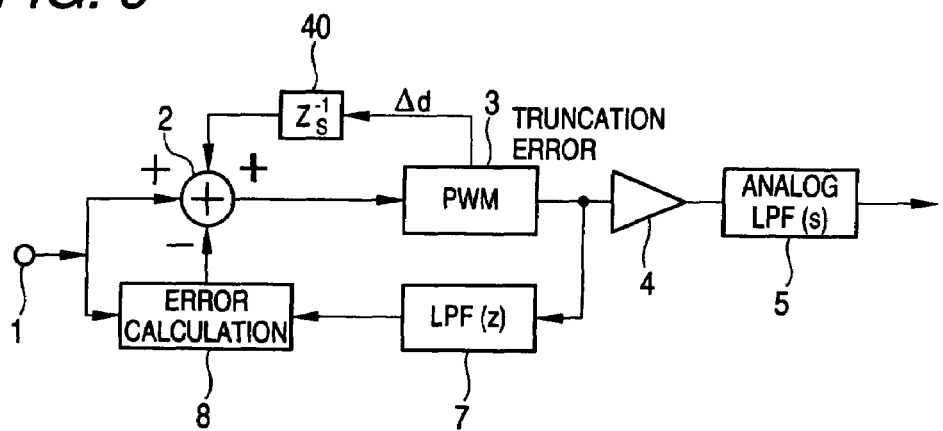
FIG. 9 is a block diagram showing the construction of a Class-D amplifier according to a fifth embodiment of the present invention.

FIG. 9 is a block diagram showing the construction of a Class-D amplifier according to a fifth embodiment of the present invention. This embodiment is different from the embodiment shown in FIG. 1 in that there is provided a primary delay circuit 40 (noise shaper) for delaying a truncation error occurring in the PWM circuit by one period of the sampling clock of an input signal input to the PWM circuit 3 and returning the delayed truncation error to the calculator 2. The calculator 2 subtracts the output of the error calculator 8 from the input data of the input terminal 1, adds the subtraction result with the output of the primary delay circuit 40 and then outputs it.

Here, the truncation error is an error based on the difference between the bit number of the input data and the bit number of the PWM circuit 3. For example when the input data is. 0.505 and the PWM circuit 3 can output only a signal having a pulse width of 0.50 to the input data, the truncation error Δd=0.005. Therefore, the truncation error Δd is delayed by one clock and then returned to the input side.

The primary delay circuit 40 described above constitutes a primary 1R filter, and the transfer function thereof is as follows.

$$1/(1-Z^{-1}{}_s)$$

When the sampling frequency of the input signal (digital music data) input to the PWM circuit 3 is set to 320 kHz, since the primary delay circuit provides an effect of suppressing noise by 6 dB/oct, the dynamic range can be enhanced by about 24 dB when outputting audio signal of 20 kHz. Furthermore, if a secondary delay circuit is used in place of the primary delay circuit 40, the dynamic range can be enhanced by about 48 dB. FIG. 10 shows the construction when the secondary delay circuit is used, and the transfer function of the secondary delay circuit is as follows.

$$1/(1-AZ^{-1}{}_s-BZ^{-2}{}_s)$$

Figure 10:
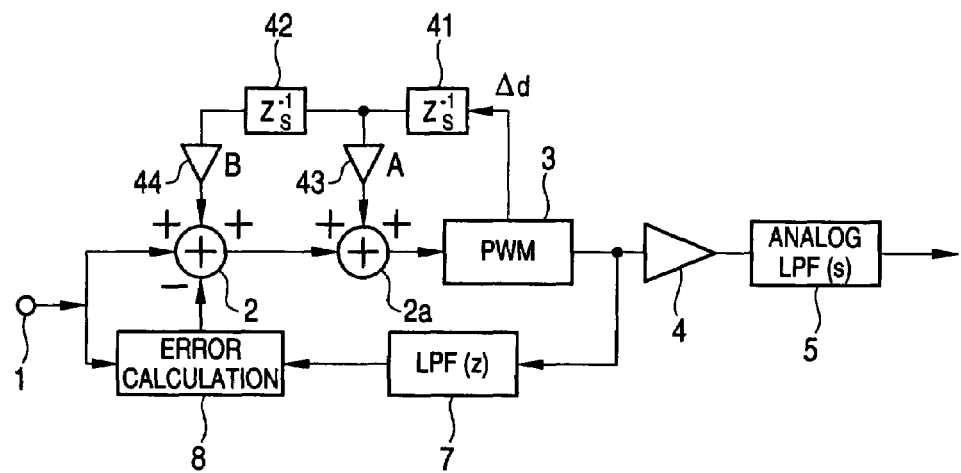
FIG. 10 is a block diagram showing a modification of the fifth embodiment.
Figure 11:
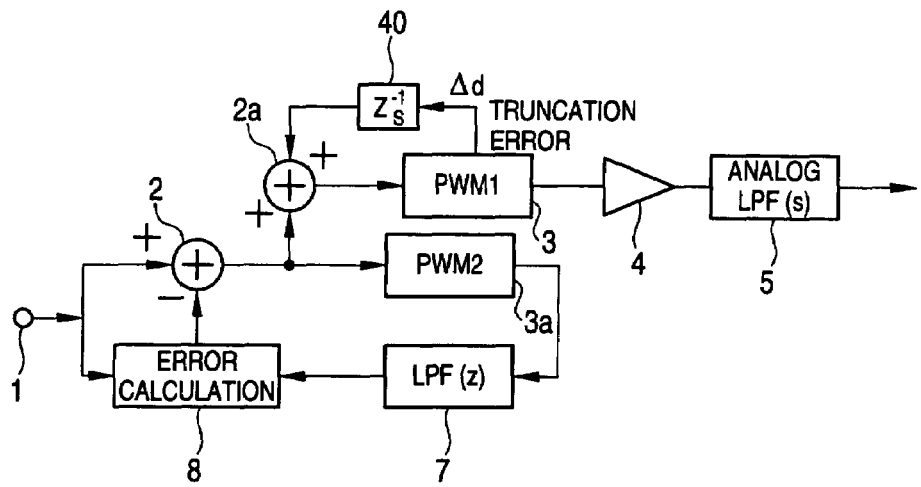
FIG. 11 is a block diagram showing a modification of the fifth embodiment.

In FIG. 10, 41 and 42 represent a delay circuit for delaying the sampling clock of the input signal input to the PWM circuit 3, and 43 and 44 represent a multiplier for multiplying constants A, B respectively.

The circuits shown in FIGS. 9 and 10 have a problem that the feedback loop is duplicative and it is difficult to design a stable loop. FIG. 11 shows a circuit which can solve this problem. In the circuit shown in FIG. 11, a PWM circuit 3a having the same construction as the PWM circuit 3 is connected to the output of the calculator 2, and the feedback loop comprising the digital low-pass filter 7 and the error calculator 8 is connected to the output of the PWM circuit 3a. Accordingly, the feedback loop of the digital low-pass filter 7 and the feedback loop of the truncation error Δd are different loops. The output of the calculator 2 is input to a newly provided calculator 2a, and added with the output of the delay circuit 40 in the calculator 2a. This addition result is input to the PWM circuit 3.

Sixth Embodiment

Figure 12:
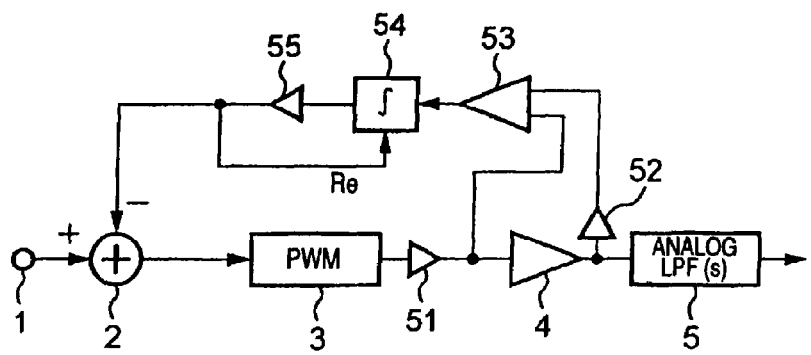
FIG. 12 is a block diagram showing the construction of a Class-D amplifier according to a sixth embodiment of the present invention.

Next, a sixth embodiment of the present invention will be described. FIG. 12 is a block diagram showing the construction of the sixth embodiment of the present invention, and in FIG. 12, the parts corresponding to these parts of FIG. 1 are represented by the same reference numerals, and the description thereof is omitted. In FIG. 12, 51 represents a pre-buffer, and 52 represents an attenuator. The attenuator 52 attenuates the output level of the buffer amplifier 4 till the output level of the pre-buffer 51. 53 represents a differential amplifier for amplifying the difference between the output of the pre-buffer 51 and the output of the attenuator 52, and 54 represents an integrator. The integrator 54 integrates the output of the differential amplifier 53, and it is reset by a reset signal Re. 55 represents a comparator for outputting data "0" to the calculator 2 when the output of the integrator 54 is not more than affixed value, and outputs data "1" to the calculator 2 when the output of the integrator 54 is not less than the fixed value. The data "1" is output as the reset signal Re to the integrator 54.

The operation of this embodiment is as follows. That is, the time constant of the low-pass filter at the rear stage of the buffer amplifier 4 is large, and the load is directly driven by the output of the low-pass filter 5 in many cases, so that the capacitance needed to the buffer amplifier 4 is large. Therefore, no correct square wave form can be achieved due to ringing or voltage variation, and distortion occurs. Therefore, in this embodiment, the power source for the main buffer 4 and the pre-buffer 51 for driving the main buffer 4 is divided, and the voltages thereof are adjusted so as to be equal to each other. Thereafter, the signal difference (distortion component) between the input and output of the buffer amplifier 4 by the differential amplifier 53 is determined, the signal difference thus determined is integrated, and the integration value is added to the input side of the PWM circuit 3 when the integration value exceeds a preset fixed value. At this time, the integrator 54 is reset at the same time. A resistor and LPF may be used for the gain around DC so as to stabilize the loop. In this case, it is not necessary to reset the integrator 54. Furthermore, the integrator 54 may be subjected to phase compensation to stabilize the loop, or not analog processing, but digital processing maybe carried out.

Seventh Embodiment

Figure 13:
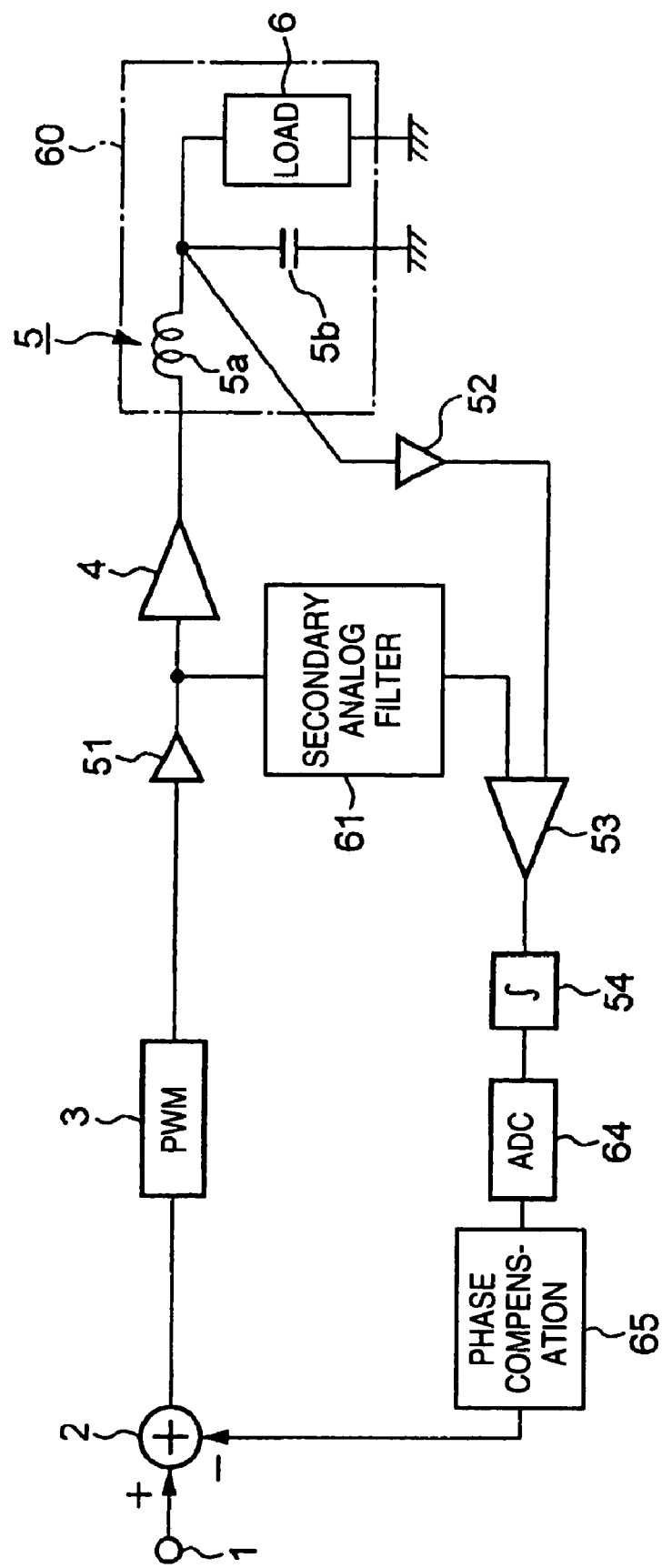
FIG. 13 is a block diagram showing the construction of a Class-D amplifier according to a seventh embodiment of the present invention.

Next, a seventh embodiment according to the present invention will be described. FIG. 13 is a block diagram showing the construction of the seventh embodiment of the present invention. In FIG. 13, the parts corresponding to the parts shown in FIG. 12 are represented by the same reference numerals, and the description thereof is omitted. This embodiment is a circuit aiming to remove both the distortion based on the buffer amplifier 4 and the distortion based on the low-pass filter 5 in consideration of the fact that distortion occurs in the low-pass filter 5 comprising a coil 5a and a capacitor 5b. In FIG. 13, 61 represents a secondary analog filter, and has the same transfer characteristic as the circuit 60 comprising the low-pass filter 5 and the load 6. That is, the output of the secondary analog filter 61 becomes a music waveform containing no distortion based on the buffer amplifier 4 and the low-pass filter 5, and input to the first input terminal of the differential amplifier 53. On the other hand, the signal at the input terminal of the load 6 is subjected to level adjustment by the attenuator 52, and input to the second input terminal of the differential amplifier 53.

The differential amplifier 53 amplifies the difference between both the signals to extract a distortion component based on the buffer amplifier 4 and the low-pass filter 5, and outputs the distortion component to the integrator 54. The integrator 54 integrates the output of the differential amplifier 53, and outputs it to the analog/digital converter 64. The analog/digital converter 64 converts the output of the integrator 54 to digital data, and outputs the digital data to the calculator 2 through a phase compensating circuit 65 for preventing oscillation. The calculator 2 subtracts the output of the phase compensating circuit 65 from the input data of the input terminal 1, and outputs the subtraction result to the PWM circuit 3.

The comparator may be used as an analog/digital converter of 1 bit in place of the analog/digital converter 64 as in the case of FIG. 12. The integrator 54 may process data not by an analog portion, but also by the phase compensating circuit 65 of the digital portion.

Figure 14:
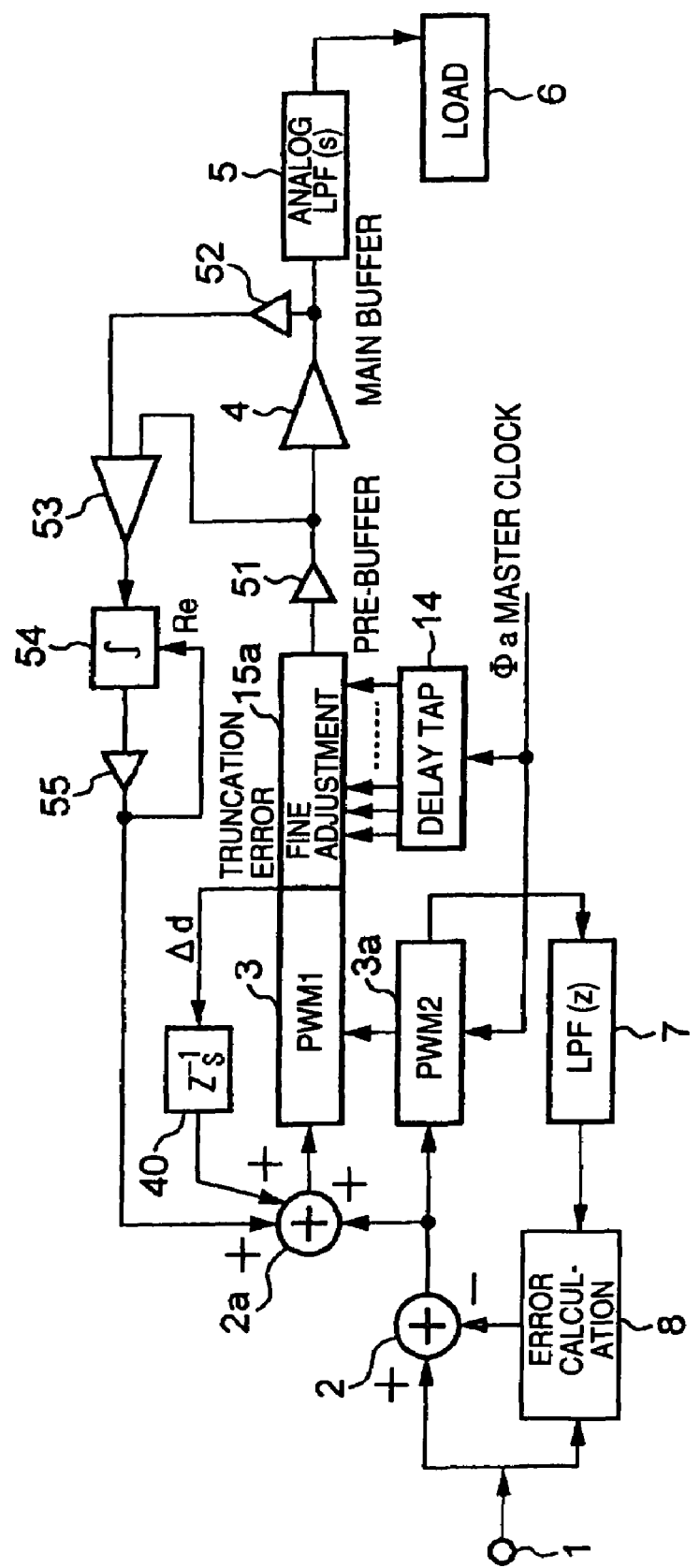
FIG. 14 is a block diagram showing the construction of a Class-D amplifier according to an eighth embodiment of the present invention.

FIG. 14 is a block diagram showing the construction of an eighth embodiment of the present invention which is constructed by combining the respective embodiments described above, and the embodiments of FIG. 5, FIG. 11 and FIG. 12 are combined. In FIG. 14, the circuit portion for adjustment of falling in the selector 15 and the PWM circuit 12 of FIG. 5 is shown as a fine adjustment circuit 15a.

It is needless to say that various other combinations than the above combination may be used.

Figure 15:
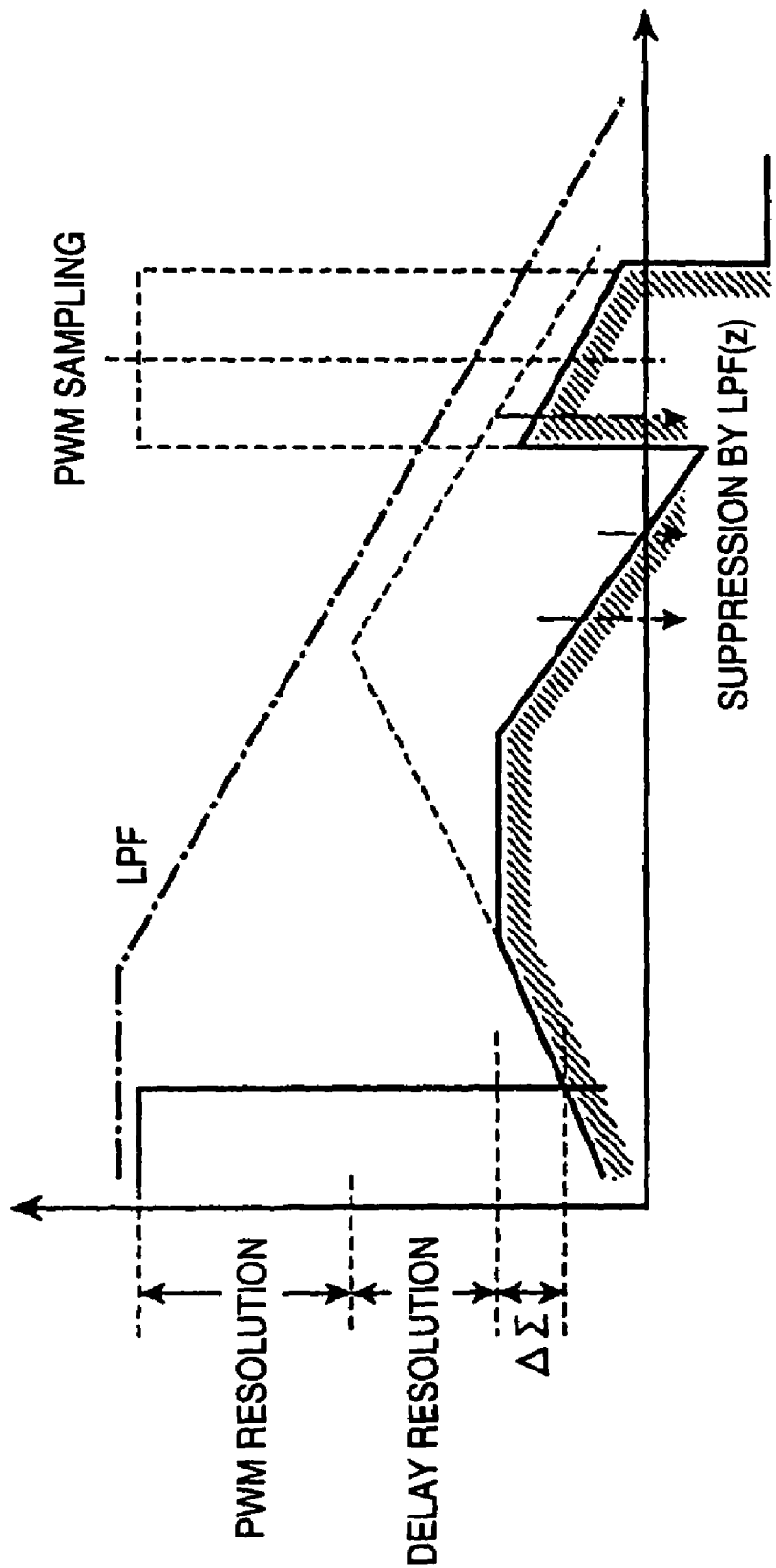
FIG. 15 is a diagram showing an effect of the eighth embodiment.

The effect of the eighth embodiment described above is shown in FIG. 15. The resolution of PWM when normal clocks are used is equal to about 1024 ($2^{10}$) steps and the dynamic range is equal to about 60 dB if the master clock of about 3 ns (333 MHz) is used and the sampling frequency is set to 320 kHz. When the resolution is enhanced by using the delay tap circuit 14, the resolution is enhanced to be about 32 ($2^5$) times as high as the previously described master clock at about 90 ps in consideration of the jitter of the circuit, and thus the dynamic range is enhanced by 30 dB. When the analog low-pass filter 5 is secondary, assuming that the ΔΣ noise shaper of the low-order bits of the PWM circuit 3 is secondary, 24 dB {20*Log (20 k/320k)} noise is reduced in case of outputting an audio signal of 20 kHz (FIG. 10). The noise is reduced by 50 dB when outputting an audio signal of 1 kHz. As a result, the total dynamic range is equal to 114 dB when outputting an audio signal of 20 kHz, and equal to 140 dB when outputting an audio signal of 1 kHz. Furthermore, a broad-area noise based on noise shaping and a turnup noise based on PWM sampling are reduced by the analog low pass filter 5, and a residual noise of the PWM conversion is reduced by the digital low-pass filter 7.

What is claimed is:

1. A Class-D amplifier comprising:
a delaying circuit that outputs signals respectively obtained by delaying rising or falling of a master clock by m/n period, where n is an integer of 2 or more and m is an integer smaller than n;

a selecting circuit for selecting one of output signals of the delay circuit on the basis of a first group of bits of an input signal input to an input terminal of the Class-D amplifier; and a PWM circuit that converts a second group of the bits of the input signal to a pulse width modulation signal on the basis of the master clock, and generates a pulse signal that rises or falls at a timing indicated by the second group of the bits of the input signal and falls or rises at a timing delayed from the falling or rising timing indicated by the second group of bits by a time indicated by an output of the selecting circuit.

2. The Class-D amplifier according to claim 1, wherein the delaying circuit comprises:

a ring oscillator comprising a plurality of delay amount variable inverters arranged in a ring shape;

a phase comparator that detects a phase difference between the master clock and an output of the ring oscillator;

a delay amount controller that controls a delay amount of each of the inverters; and a low-pass filter that extracts low-frequency components of an output of the phase comparator and outputs the low-frequency components to an input terminal of the delay amount controller.

* * * * *